United States Patent
Kumar et al.

(10) Patent No.: US 12,255,110 B2
(45) Date of Patent: Mar. 18, 2025

(54) METHODS AND SYSTEMS FOR REAL-TIME QUALITY CONTROL OF A FILM IN A SPIN COATING PROCESS

(71) Applicant: Samsung Electronics Co., Ltd., Suwon-si (KR)

(72) Inventors: Gaurav Kumar, Bengaluru (IN); Lakshmi Narayana Pedapudi, Bengaluru (IN); Sameera Bharadwaja Hayavadana, Bengaluru (IN); Sathyanarayanan Kulasekaran, Bengaluru (IN); Shashank Shrikant Agashe, Bengaluru (IN); Wan Sung Park, Seoul (KR); Sung Ha Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 570 days.

(21) Appl. No.: 17/341,619

(22) Filed: Jun. 8, 2021

(65) Prior Publication Data

US 2022/0344220 A1    Oct. 27, 2022

(30) Foreign Application Priority Data

Apr. 14, 2021 (IN) .............................. 202141017408

(51) Int. Cl.
*H01L 21/66* (2006.01)
*G01B 11/06* (2006.01)
(Continued)

(52) U.S. Cl.
CPC .......... *H01L 22/26* (2013.01); *G01B 11/0616* (2013.01); *G01N 21/8422* (2013.01);
(Continued)

(58) Field of Classification Search
CPC ............ G01B 11/0616; G01B 11/0633; G01B 11/0683; H01L 22/26; H01L 21/67253;
(Continued)

(56) References Cited

U.S. PATENT DOCUMENTS 6,324,298 B1   11/2001   Odell et al.
7,030,039 B2   4/2006    Gurer et al.
(Continued)

FOREIGN PATENT DOCUMENTS

EP    1403613 A1 *  3/2004  ............. B60C 11/24
KR    1020040030518 A   4/2004
(Continued)

OTHER PUBLICATIONS

"Compressed sensing" Wikipedia, Retrieved from URL: https://en.wikipedia.org/wiki/Compressed_sensing (Retrieved on Feb. 26, 2021).
(Continued)

*Primary Examiner* — Michael P LaPage
(74) *Attorney, Agent, or Firm* — Myers Bigel, P.A.

(57) ABSTRACT

Example embodiments may provide methods for determining a quality of a film in spin coating process. The methods may include capturing images of portions of the film using an imaging device while coating the film on a substrate using a spinner. The imaging device may include SPCs and lens and/or SLMs. The methods may also include determining whether a characteristic of the film matches to a standard based on the images of the portions of the film. The method may further include performing detecting that the quality of the film is optimal in response to determining that the characteristic of the film matches to the standard or detecting that the quality of the film is not optimal in response to determining that the characteristic of the film does not match to the standard.

18 Claims, 12 Drawing Sheets

(51) Int. Cl.

| | |
|---|---|
| *G01N 21/84* | (2006.01) |
| *G03F 7/16* | (2006.01) |
| *G03F 7/30* | (2006.01) |
| *G06T 7/00* | (2017.01) |
| *H01L 21/67* | (2006.01) |
| *H01L 21/02* | (2006.01) |

(52) U.S. Cl.
CPC ............ *G03F 7/162* (2013.01); *G03F 7/3028* (2013.01); *G06T 7/0006* (2013.01); *H01L 21/6715* (2013.01); *H01L 21/67253* (2013.01); *G06T 2207/30148* (2013.01); *H01L 21/02282* (2013.01); *H01L 21/02623* (2013.01)

(58) Field of Classification Search
CPC ......... H01L 21/02282; H01L 21/02623; H01L 21/6715; G03F 7/162; G03F 7/3028; G06T 7/0006; G06T 2207/30148; G06T 7/0004; G01N 21/8422; G01N 21/8806; G01N 21/8851; G01N 21/9501; G01N 2021/8854; G01N 2021/8887
See application file for complete search history.

(56) References Cited

U.S. PATENT DOCUMENTS

| | | | |
|---|---|---|---|
| 8,004,020 | B2 | 8/2011 | Kawasaki |
| 8,552,299 | B2 | 10/2013 | Rogers et al. |
| 9,176,183 | B2 | 11/2015 | Zhu et al. |
| 10,062,157 | B2 | 8/2018 | Pandev et al. |
| 2004/0227822 | A1 | 11/2004 | Cartlidge et al. |
| 2007/0148344 | A1 | 6/2007 | Kobayashi et al. |
| 2019/0033233 | A1 | 1/2019 | Amanullah et al. |
| 2019/0041192 | A1* | 2/2019 | Bourne ................... F01D 5/288 |
| 2020/0033723 | A1* | 1/2020 | Yang ........................ H01L 22/10 |
| 2020/0182605 | A1* | 6/2020 | Junger ............... G01B 11/0658 |
| 2021/0097673 | A1* | 4/2021 | Neumann ............. G06T 7/0004 |
| 2021/0134637 | A1* | 5/2021 | Carcasi ..................... G06T 7/13 |
| 2021/0210392 | A1* | 7/2021 | Carcasi ............. G01B 11/0691 |
| 2021/0374936 | A1* | 12/2021 | Koopman .............. G06N 3/084 |
| 2022/0130028 | A1* | 4/2022 | Jimbo ................... G03F 7/0002 |
| 2024/0119582 | A1* | 4/2024 | Zhang ....................... G03F 1/36 |

FOREIGN PATENT DOCUMENTS

| | | | |
|---|---|---|---|
| KR | 101755207 B1 | 7/2017 | |
| TW | 201304064 A | 1/2013 | |
| WO | WO-2020094520 A1 * | 5/2020 | ......... G01B 11/0616 |

OTHER PUBLICATIONS

"Nyquist-Shannon sampling theorem" Wikipedia, Retrieved from URL: https://en.wikipedia.org/wiki/Nyquist-Shannon_sampling_theorem (Retrieved on Feb. 26, 2021).
"Single Pixel Camera" Vocal Technologies, Retrieved from URL: https://www.vocal.com/compressed-sensing/single-pixel-camera/ (Retrieved on Feb. 26, 2021).
"Spin coating" Wikipedia, Retrieved from URL: https://en.wikipedia.org/wiki/Spin_coating (Retrieved on Feb. 26, 2021).
Boyd et al. "Distributed Optimization and Statistical Learning via the Alternating Direction Method of Multipliers" Foundations and Trends (R) in Machine Learning. vol. 3, No. 1:1-122 (2010).
Hardesty, "A faster single-pixel camera" MIT News, 5 pages (Mar. 29, 2017).
Harumoto et al. "Fundamental study of spin-coating using in-situ analysis and simulation" SPIE Advanced Lithography (2015). Retrieved from URL: https://www.spiedigitallibrary.org/conference-proceedings-of-spie (Retrieved on Mar. 16, 2021).
Harumoto et al. "In-situ analysis of defect formation in coat develop track process" SPIE Advanced Lithography (2014). Retrieved from URL: https://www.spiedigitallibrary.org/conference-proceedings-of-spie (Retrieved on Mar. 16, 2021).
Hassan et al. "3D Distance Measurement Accuracy on Low-Cost Stereo Camera" Sci.Int. (Lahore). 29(3):599-605 (2017).
Kang et al. "Using Wafer Map Features to Better Predict Die-Level Failures in Final Test" IEEE Transactions on Semiconductor Manufacturing. vol. 28, No. 3:431-437 (Aug. 2015).
Li et al. "Phase-only transmissive spatial light modulator based on tunable dielectric metasurface" Science. vol. 364, Issue 6445:1087-1090 (Jun. 14, 2019).
Peng et al. "Design of high-speed phase-only spatial light modulators with two-dimensional tunable microcavity arrays" Optics Express. vol. 27, No. 21:30669-30681 (Oct. 14, 2019).
Shi et al. "Compressive Sensing based Single-Pixel Hyperspectral Camera" Retrieved from URL: http://stanford.edu/class/ee367/Winter2015/report_shi_shrestha.pdf (Retrieved on Feb. 26, 2021).
Sohn et al. "A new method for wafer quality monitoring using semiconductor process big data" SPIE Advanced Lithography (2017). Retrieved from URL: https://www.spiedigitallibrary.org/conference-proceedings-of-spie (Retrieved on Mar. 16, 2021).
Toolan. "In situ studies of spin-coated polymer films" The University of Sheffield. Retrieved from URL: http://etheses.whiterose.ac.uk/7056/1/Daniel%20TW%20Toolan%20PhD%20Thesis.pdf (Retrieved on Jun. 1, 2021).
Tyona "A theoritical study on spin coating technique" Advances in Materials Research. vol. 2, No. 4:195-208 (2013).
Yang et al. "Alternating Direction Algorithms for '1-Problems in Compressive Sensing" CAAM TR09-37 (Revised Jun. 6, 2010).
"Hearing Notice, corresponding to Indian application No. 202141017408, dated Apr. 24, 2024, 3 pages".
"Office Action, corresponding to Indian Application No. 202141017408, dated Jul. 12, 2022, 5 pgs".

* cited by examiner

METHODS AND SYSTEMS FOR REAL-TIME QUALITY CONTROL OF A FILM IN A SPIN COATING PROCESS

CROSS-REFERENCE TO RELATED APPLICATION

This application claims priority to Indian Patent Application No. 202141017408 filed on Apr. 14, 2021 in the Indian Intellectual Property Office, and all the benefits accruing therefrom under 35 U.S.C. 119, the disclosure of which in its entirety is herein incorporated by reference.

FIELD

The present disclosure generally relates to spin coating processes, and more specifically, to methods and systems for determining and controlling a quality of a film in spin coating processes in real-time.

BACKGROUND

Spin coating is a coating technique used in a semiconductor wafer manufacturing process to uniformly deposit a liquid (e.g., a photoresist, a developer, and/or a solvent) onto a substrate (e.g., a semiconductor substrate or a wafer) as a thin film using a centrifugal force and a liquid-vapor interface. Usually, a small amount of a liquid is applied to a center of the substrate. Dispensing of the liquid takes place when a spinner is rotating or stationary depending on processes and process conditions. If the spinner is stationary while dispensing the liquid, then the spinner along with the substrate starts rotating after dispensing the liquid to uniformly spread the liquid. If the spinner is rotating while dispensing the liquid, then the spinner along with the substrate speeds up rotation after dispensing the liquid to uniformly spread the liquid. An acceleration and a speed of the rotation of the spinner are factors that may be used to control characteristics of the film. A uniformity of the film coated over the substrate is one of various factors in deciding a quality of the coating. The film may include various defects when the liquid is not deposited uniformly on the substrate. Several approaches have been developed to identify the uniformity of the film after finishing a coating process to assess a quality of a wafer (e.g., a quality of a film formed on the wafer), which may not be useful for real-time evaluation of the quality of the wafer.

Real-time monitoring of a film may be used to analyze deformations of the film. Further, dynamic adjustment of parameters associated with a spin coating process may be used to maintain uniformity of a film in real-time.

SUMMARY

Some embodiments of the invention may provide methods and systems for determining a quality of a film in a spin coating process. The system may scan the film in real-time, may enable in-situ quality prediction of the film, and may control parameters of the spin coating process to form the film having an acceptable or desirable quality (e.g., optimal quality) of the film.

Some embodiments of the invention provide imaging devices for creating an image of a film in a spin coating process using images of portions of the film captured by, for example, distributed Single Pixel Cameras (SPCs) of the imaging device. Due to not using any mechanical parts such as a camera shutter, the imaging device may capture the images of the portions of the film in a high frame rate based on a sampling rate to capture the images. Therefore, the images of the portions of the film may be very clear and may provide useful information about the film.

Some embodiments of the invention provide imaging devices for capturing an image of a film under an exposure of a visible or invisible light spectrum. The exposure of the invisible light spectrum (e.g., infra-red) may expose many hidden or extra characteristics such as a relative viscosity of the film different locations or areas of the film, which may be invisible under the exposure of the visible light spectrum.

According to some embodiments of the invention, methods for determining a quality of a film in a spin coating process may include capturing, by a system, images of portions of the film using an imaging device while coating the film on a substrate using a spinner of the system. The imaging device may include SPCs and lens and/or Spatial Light Modulators (SLMs). The method may also include determining, by the system, whether a characteristic of the film matches to a standard based on the images of the portions of the film (e.g., whether the film has a target characteristic based on the images of the plurality of portions of the film). The method may further include performing, by the system, detecting that the quality of the film is acceptable (e.g., optimal), in response to determining that the characteristic of the film matches to the standard, or detecting that the quality of the film is not acceptable (e.g., not optimal), in response to determining that the characteristic of the film does not match to the standard.

In some embodiments, where determining, by the system, whether the characteristic of the film matches to the standard based on the images of the portions of the film, may include generating, by the system, an image of the film using the images of the portions of the film, estimating, by the system, the characteristic of the film using the image of the film, and determining, by the system, whether the characteristic of the film matches to the standard (e.g., whether the characteristic of the film is identical to the target characteristic of the film).

In some embodiments, where determining, by the system, whether the characteristic of the film matches to the standard based on the images of the portions of the film, may include generating, by the system, an image of the film using the images of the portions of the film, determining, by the system, pixel values of the image of the film, generating, by the system, a heat map of the image of the film based on the pixel values in the image, and determining, by the system, whether the characteristic of the film matches to the standard based on the heat map.

In some embodiments, the method may additionally include determining, by the system, parameters of the spin coating process, in response to detecting that the quality of the film is not optimal, estimating, by the system, a thickness of the film at an end of the spin coating based on the parameters, and modifying or adjusting, by the system, the parameters of the spin coating process to achieve a standard thickness of the film within a remaining time for the end of the spin coating (i.e., to form the film having a target thickness at the end of the spin coating process).

In some embodiments, the parameters of the spin coating process may include, for example, a spin speed of the spinner, a spin acceleration of the spinner, a drying rate of the film, a time to complete the spin coating process, an ambient temperature, an ambient pressure, and/or an ambient humidity.

In some embodiments, the characteristic of the film may include, for example, a current thickness of the film, a uniformity of the film across the substrate, a viscosity of a film fluid, a radial velocity of the film fluid, a density of the film fluid, and/or an area of the substrate covered by the film.

In some embodiments, the SLM may be a Transmissive Spatial Light Modulator (TSLM) and/or a Reflective Spatial Light Modulator (RSLM).

According to some embodiments of the invention, systems for determining a quality of a film in a spin coating process may include an imaging device, a spinner, and a film quality controller. The film quality controller may be coupled to the imaging device and the spinner. The imaging device may include SPCs and lens and/or the SLMs. The film quality controller may be configured to capture images of the portions of the film using the imaging device while coating the film on a substrate using the spinner. The film quality controller may be configured to determine whether the characteristic of the film matches to the standard based on the images of the portions of the film. The film quality controller may be configured to perform one of: detecting that the quality of the film is optimal, in response to determining that the characteristic of the film matches to the standard, and detecting that the quality of the film is not optimal, in response to determining that the characteristic of the film does not match to the standard.

According to some embodiments of the invention, an imaging device for creating an image of a film in a spin coating process may include a memory, a processor, SPCs, a film image generator, lens and/or SLMs. The film image generator may be coupled to the memory and the processor. The film image generator may be configured to capture images of the portions of the film using the SPCs and the lens and/or the SLMs while coating the film on a substrate. The film image generator may be configured to generate the image of the film using the images of the portions of the film.

In some embodiments, the imaging device may be configured to capture the image of the film under an exposure of visible and invisible light spectrums.

In some embodiments, the SPCs may be randomly distributed in the imaging device not to block Field of Views (FOVs) each other.

In some embodiments, the lens may be a micro lens and/or a correction lens.

In some embodiments, the correction lens may be configured to receive light reflected from the film and may be configured to focus the light to an aperture, where each SPC captures the image of each portion of the film by receiving the light from the aperture through the micro lens.

In some embodiments, the SLM may include a first Transmissive SLM (TSLM) and a second TSLM In some embodiments, the first TSLM or the lens may be configured to receive light reflected from the film and may be configured to focus the light to an aperture, where the SPC captures the image of each portion of the film by receiving the light from the aperture through the second TSLM.

In some embodiments, the SLM may include the first TSLM and a the RSLM.

In some embodiments, the first TSLM or the lens may be configured to receive light reflected from the film and may be configured to focus the light to an aperture, where the RSLM reflects the light from the aperture to the SPC, and the SPC captures the image of each portion of the film based on the light reflected from the RSLM.

These and other aspects of embodiments of the invention will be better appreciated and understood when considered in conjunction with the following description and the accompanying drawings. It should be understood, however, that the following descriptions, while discussing example embodiments and numerous specific details thereof, are given by way of illustration and not of limitation. Many changes and modifications may be made within the scope of the invention without departing therefrom, and embodiments of the invention include all such modifications.

BRIEF DESCRIPTION OF DRAWINGS

Example embodiments of the invention are illustrated in the accompanying drawings, throughout which like reference letters and numerals refer to like elements. Example embodiments of the invention will be better understood from the following description with reference to the drawings, in which.

DETAILED DESCRIPTION OF INVENTION

Figure 1:
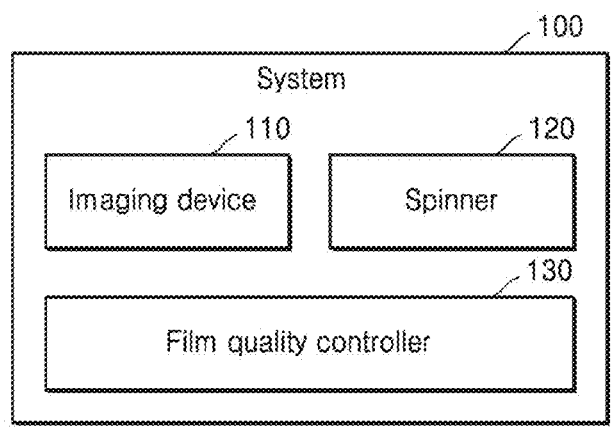
FIG. 1 is a block diagram of a system for determining a quality of a film in a spin coating process, according to some embodiments of the invention.

Embodiments, various features, and advantageous details thereof are explained more fully with reference to non-limiting example embodiments that are illustrated in the accompanying drawings and detailed in the following description. Descriptions of well-known components and processing techniques may be omitted so as to not unnecessarily obscure the embodiments described herein. Also, the various embodiments described herein are not necessarily mutually exclusive, as some embodiments can be combined with one or more other embodiments to form new embodiments. The term "or" as used herein, refers to a non-exclusive or, unless otherwise indicated. The examples used herein are intended merely to facilitate an understanding of ways in which embodiments of the invention can be practiced and to further enable those skilled in the art to practice those embodiments. Accordingly, the examples should not be construed as limiting the scope of the invention.

As is traditional in the field, embodiments may be described and illustrated in terms of blocks which carry out a described function or functions. These blocks, which may be referred to herein as managers, units, modules, hardware components or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the invention. Likewise, the blocks of the embodiments may be physically combined into more complex blocks without departing from the scope of the invention.

A film may be analyzed using an image of the film captured in real-time. However, cameras with low frame rates may not be useful to perform such tasks. Further, a single camera may have a trade-off between image resolution and Field of View (FOV). To capture a high image resolution of about 0.1 mm, the single camera may not be suitable, and multiple cameras may be used. However, data of the image generated by the multiple cameras such as Complementary Metal Oxide Semiconductor (CMOS) cameras may be huge with generation bandwidth (~10 Gbps), which may increase a processing time of the data. Generally, a spin coating process may take nearly 10 minutes. So, it would be computationally challenging to process data from the multiple cameras within the time frame of 10 minutes and to decide an adjustment in the parameters associated with a spin coating process.

Some embodiments of the invention provide methods for determining a quality of a film in a spin coating process. The method includes capturing, by a system, an image of portions of the film using an imaging device while coating the film on a substrate using a spinner of the system, where the imaging device including SPCs and lens and/or Spatial Light Modulators (SLMs). The method includes determining, by the system, whether a characteristic of the film matches to a standard (e.g., a target characteristic) based on the images of the portions of the film. The method includes performing, by the system, one of: detecting that the quality of the film is acceptable or desirable (e.g., optimal), in response to determining that the characteristic of the film matches to the standard; and detecting that the quality of the film is not acceptable or desirable (e.g., not optimal), in response to determining that the characteristic of the film does not match to the standard.

Some embodiments of the invention provide systems for determining a quality of a film in a spin coating process. The system includes an imaging device, a spinner, and a film quality controller, where the film quality controller is coupled to the imaging device and the spinner. The imaging device includes SPCs and lens and/or the SLMs. The film quality controller is configured to capture an image of portions of the film using the imaging device while coating the film on the substrate using the spinner. The film quality controller is configured to determine whether the characteristic of the film matches to the standard based on the images of the portions of the film. The film quality controller configured to perform one of: detecting that the quality of the film is acceptable or desirable (e.g., optimal), in response to determining that the characteristic of the film matches to the standard, and detecting that the quality of the film is not acceptable or desirable (e.g., not optimal), in response to determining that the characteristic of the film does not match to the standard. As used herein, "an element A is coupled to an element B" (or similar language) may mean that the elements A and B are configured to communicate with each other and/or configured to collectively perform operations. The elements A and B may be electrically connected to each other. The term "coupled to" may be interchangeable with "operatively coupled to." As used herein the term "and/or" includes any and all combinations of one or more of the associated listed items.

Some embodiments of the invention provide imaging devices for creating an image of a film in a spin coating process. The imaging device includes a memory, a processor, the SPCs, a film image generator, the lens and/or SLMs, where the film image generator is coupled to the memory and the processor. The film image generator is configured to capture the images of the portions of the film using the SPCs and the lens and/or the SLMs, while coating the film on the substrate. The film image generator is configured to generate the image of the film using the images of the portions of the film.

Unlike existing methods and systems, systems according to some embodiments of the invention may scan a film in real-time, may enable in-situ quality prediction and/or control of the film and adjusting and/or controlling parameters of a spin coating process to form the film having an acceptable or desirable quality (e.g., an optimal quality).

Unlike existing methods and systems, imaging devices according to some embodiments of the invention may create an image of a film in a spin coating process using images of portions of the film captured by, for example, SPCs of the imaging device. Due to not using any mechanical parts such as a camera shutter, the imaging device may capture the images of the portions of the film in a high frame rate based on a sampling rate to capture the images. Therefore, the images of the portions of the film may be very clear and may provide useful information about the film.

Unlike existing methods and systems, imaging devices according to some embodiments of the invention may capture an image of a film under exposure of a visible and/or invisible light spectrum. The exposure of the invisible light spectrum (i.e., infra-red) exposes many hidden or extra characteristics like a relative viscosity of the film at different locations or areas of the film which may be invisible under the exposure of the visible light spectrum. Therefore, the hidden or extra characteristics of the film may be monitored and/or detected and parameters of a spin coating process may be adjusted and/or controlled to form the film having an acceptable or desirable quality (e.g., optimal quality).

Referring now to the drawings, and more particularly to FIGS. 1 through 8, there are shown some embodiments of the invention.

FIG. 1 is a block diagram of a system (100) for determining quality of a film in a spin coating process, according to some embodiments of the invention. In some embodiments, the system (100) may include an imaging device (110), a spinner (120), and a film quality controller (130). The film quality controller (130) may be implemented by processing circuitry such as logic gates, integrated circuits, microprocessors, microcontrollers, memory circuits, passive electronic components, active electronic components, optical components, hardwired circuits, or the like, and may optionally be driven by a firmware. The circuits may, for example, be embodied in one or more semiconductor chips, or on substrate supports such as printed circuit boards and the like.

Figure 2A:
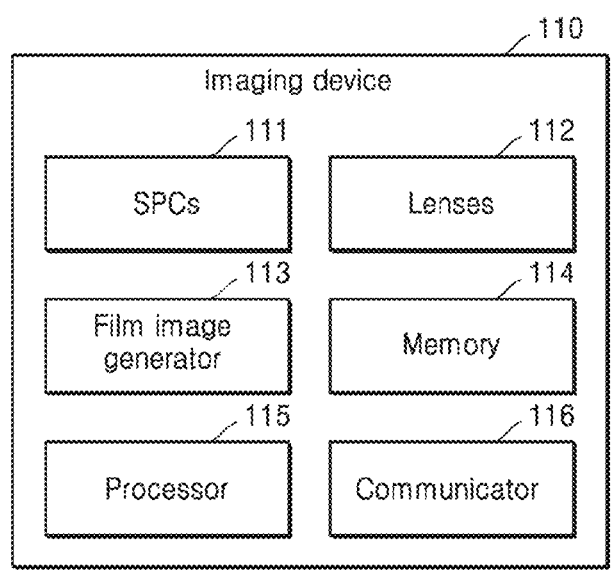
FIGS. 2A-2C are block diagrams of an imaging device of a system for generating an image of a film, according to some embodiments of the invention.
Figure 2B:
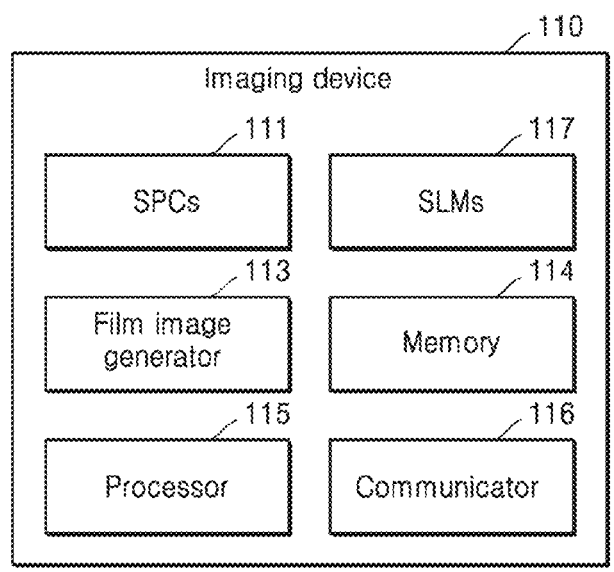
Figure 2C:
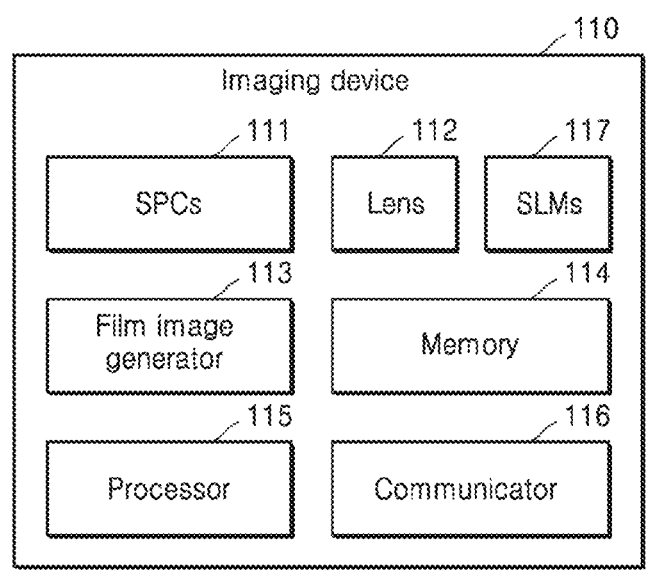

In some embodiments, the imaging device (110) may include SPCs (111), lenses (112) and/or SLMs (117), a film image generator (113), a memory (114), a processor (115), and a communicator (116) (refer FIGS. 2A-2C). The film image generator (113) may be implemented by processing circuitry such as logic gates, integrated circuits, microprocessors, microcontrollers, memory circuits, passive electronic components, active electronic components, optical components, hardwired circuits, or the like, and may optionally be driven by a firmware. The circuits may, for example, be embodied in one or more semiconductor chips, or on substrate supports such as printed circuit boards and the like. The lenses (112) may include a correction lens and/or a micro lens. The correction lens may be a type of optional lens which is provided just before an aperture to mitigate any adverse effect such as image aberration, etc. due to a large aperture. The large aperture may be used or required to increase an image resolution. The correction lens may help in mitigating an effect at global level. The correction lens may be made using a single lens made of a glass or a Transmissive SLM (TSLM). When the single glass piece is used, a global focal correction may be applied, and when the TSLM is used, multiple spatial focal correction may be applied.

The micro lens can used as a substitute of the TSLM. The micro lens may be created using a normal glass material but the normal glass material may be designed in such a manner that the normal glass material creates many micro lens with different spatial focal lengths. But the different spatial focal lengths are fixed and may not be changed. The TSLM may have similar different spatial focal length as in the micro lens, but each spatial focal length may be changed by varying an electrical voltage applied to the TSLM. Thus, the TSLM is a programmable micro lens. The SPCs (111) may be randomly distributed in the imaging device (110) without blocking a FOV of each SPC (111). The SPC (111) may have only a single pixel through which it can collect a response. The SPC (111) may not have 2D grid. The responses of the SPC (111) may be look like a dot. The single response of the SPC (111) may not be useful and may not generate any image. Image processing on a subset of pixel responses may be used or may be required to generate and/or reconstruct a full image. For example, to generate a 9 mega pixel image as above, at least 10% of the SPC responses may be collected, and the SPC (111) may not be necessarily arranged in 2D grid unlike conventional CMOS camera. So random distribution can be thought of any non-structured arrangement of SPCs (111). Each SPC (111) may be a single CMOS sensor or a single photo diode. While capturing an image, the SPC may generates only 1 response (or signal value) irrespective of the scene.

The SPC (111) may capture incoherent and sparse samples of images of the film even below Nyquist sampling limitation. When the SPC (111) is arranged in non-structured or random manner and for each SPCs (111) the single response value is getting for same objective scene, then this form of collection of response from SPCs (111) may be referred to as the incoherent and sparse samples. Further, compressed sensing technique may be used to generate and/or reconstruct an objective scene from these incoherent and sparse samples. The SPCs (111) may be low power sensors exposed to capture an image without a camera shutter. The SPCs (111) may be individually controlled for capturing the images. As the camera aperture is always opened, and no mechanical shutter is there, a frame rate may be dependent on a stabilization rate of a single photo diode or a CMOS which is very high in order of 10 KHz-MHz. Therefore, the frame rate of image capturing of the SPCs (111) are higher. Due to higher frame rate, the images may be clear and may not be subject to blur effect due to spinner motion as a spinner rotation speed varies to maximum till 0.1 KHZ but an image capturing speed 100-10000 times faster in order of 10 KHZ-MHZ. The SLM (117) may modify a spatial amplitude and a phase distribution of incident light waves. The SLM (117) may be a TSLM and/or a RSLM. The RSLM may support only reflection like optical glass mirror. The TSLM may support refraction as optical glass lens.

The memory (114) may store the images of the portions of the film and the image of the film. The memory (114) may include non-volatile storage elements. Examples of such non-volatile storage elements may include magnetic hard discs, optical discs, floppy discs, flash memories, or forms of an Electrically Programmable Memory (EPROM) or an Electrically Erasable and Programmable Memory (EEPROM). In addition, the memory (114) may, in some examples, be considered a non-transitory storage medium. The term "non-transitory" may indicate that the storage medium is not embodied in a carrier wave or a propagated signal. However, the term "non-transitory" should not be interpreted that the memory (114) is non-movable. In some embodiments, the memory (114) may be configured to store larger amounts of information than the memory (114). In some embodiments, a non-transitory storage medium may store data that may be changed over time (e.g., in Random Access Memory (RAM) or cache).

The processor (115) may be configured to execute instructions stored in the memory (114). The processor (115) may be a general-purpose processor, such as a Central Processing Unit (CPU), an Application Processor (AP), or the like, a graphics-only processing unit such as a Graphics Processing Unit (GPU), a Visual Processing Unit (VPU) and the like. The processor (115) may include multiple cores to execute the instructions. The communicator (116) may be configured to communicate internally between hardware components in the imaging device (110). Further, the communicator (116) may be configured to facilitate the communication between the imaging device (110) and other components of the system (100). The communicator (116) may include an electronic circuit specific to a standard that enables wired or wireless communication.

The film quality controller (130) may be configured to capture an image of portions of a film using an imaging device (110) while coating the film on a substrate (e.g., semiconductor substrate) using the spinner (120). The film quality controller (130) may be configured to determine whether a characteristic of the film matches to a standard based on the images of the portions of the film. The film quality controller (130) may be configured to determine whether the film has a standard characteristic based on the images of the portions of the film. In some embodiments, the film quality controller (130) may compare a characteristic of the film (e.g., a characteristic estimated by the system (100)) with the standard characteristic of the film to determine whether the characteristic is identical to the standard characteristic. The characteristic of the film may include, for example, a current thickness of the film, uniformity (e.g., uniformity of thickness and density) of film across the substrate, a viscosity of a film fluid (i.e., a liquid coated to form the film), a radial velocity of the film fluid, a density of the film fluid, and an area of the substrate covered by the film. As used herein, "standard" or "standard characteristic" may refer to a target characteristic that is usually predetermined before performing a process.

In some embodiments, the film quality controller (130) may be configured to generate an image of the film using the images of the portions of the film. In some embodiments, the image of the film is created using equation 1.

$$y = \lambda Ax + \eta = \lambda \Phi z + \eta \text{ with } z \stackrel{def}{=} \Psi x \qquad (1)$$

where, $x \in R^{N \times 1}$ is the data to be reconstructed (vectorized substrate image), given a matrix ($A = \Phi \Psi$) of size M×N with perturbation (multiplicative noise)), $\lambda$, and the measurement vector (y) of length M×1 with $\eta \sim N(0, \sigma^2 I_M)$, an M×1 additive noise, and $I_M$ is an identity matrix of size M×M. $\Phi$ is a sensing matrix where each entry is drawn from Bernoulli distribution or any deterministic design (e.g., Low Density Parity Check LDPC, Euler, Steiner Triples, Kirkman etc.). $\Psi$ is a sparsifying transformation. Under the assumption that z is sparse (e.g., compressible) with at most K non-zero/significant entries (K<<N), known compressive sensing methods like Learned Sparse Bayesian Learning (L-SBL), (Learned Iterative Soft Thresholding Algorithm (L-ISTA), Alternating Direction Method of Multipliers (ADMM)-net, Generalized/Vector Approximate Message Passing (G/V AMP), Orthogonal Matching Pursuit (OMP) may be used for the reconstruction.

In compressed sensing a transfer matrix A may be designed to convert incoherent and sparse signals collected using the SPCs (111) to a full reconstructed image. The creation of the transfer matrix A may be done using several mathematical as well as learning methods. Once such is based on supervised training by imaging known the scene and collecting the incoherent and sparse samples using the non-structured arrangement of SPCs (111). For example, during an equipment qualification mode using multiple conventional CMOS camera, few high resolution static image of a wafer with a thin substrate may be created. The non-structured arrangement of SPCs (111) may be used to collect the incoherent and sparse samples of the same scene and then do supervised training using the ADMM-net to learn or obtain the transfer matrix A needed for the equation 1.

In some embodiments, the ADMM-Net may be used to construct the image of the film using the images of the portions of the film. The ADMM-net with 15-stages may be trained with 7e5 epochs using a train dataset containing 500 SEM images under-sampled at a 20% rate. The film quality controller (130) may be configured to estimate the characteristic of the film using the image of the film.

In some embodiments, the film quality controller (130) may be configured to obtain two images of the film captured at same instant using two imaging devices (110A, 110B) with a fixed stereo displacement. Further, the film quality controller (130) may be configured to convert back an image disparity obtained from the two images into an image depth. Further, the film quality controller (130) may be configured to estimate the characteristic of the film using the image depth. In some embodiments, an area covered by the film may be determined by applying the reconstructed image of the film and the substrate to a trained compressive sensing model. In some embodiments, the viscosity and the density of the film fluid may be determined based on the area covered by the film, and a time and a speed of the rotation. In some embodiments, the uniformity of the film may be determined by measure fringes seen on the reconstructed image and identifies the thickness across the substrate using an optics-based model. The film quality controller (130) may be configured to determine whether the characteristic of the film matches to standard values of the characteristic.

In some embodiments, the film quality controller (130) may be configured to determine pixel values of the image, in response to generate the image of the film using the images of the portions of the film. Further, the film quality controller (130) may be configured to generate a heat map of the image based on the pixel values in the image. The heat map may show magnitude of the pixel values as various color in two dimensions. The variation in the color may be by hue or intensity, giving obvious visual cues to a viewer about film characteristics such as thickness, viscosity etc. Further, the film quality controller (130) may be configured to determine whether the characteristic of the film matches to the standard based on the heat map.

For each of the characteristics of the film, the heat map may be generated. For example, a first heat map may show variation in the thickness of the film, and a second heat map may show variation in the viscosity of the film. There may be various ways to determine or verify where the characteristics matches with the standard. For example, during new product qualification stage, ranges of desirable values (e.g., ideal values) of the thickness of the film and/or the viscosity of the film fluid may be measured and saved as reference for a production stage. These ranges may be refer to as the standard. During the production stage if the thickness and the viscosity may be calculated from the heat map in percentage area of the wafer not lying within a range as defined by the standard. If that percentage is within 10%, the process may be continued as the thickness and the viscosity is acceptable or desirable (e.g., optimal). If that percentage is greater than 10%, process control may start as the thickness and the viscosity is not acceptable or desirable (e.g., non-optimal). 10% mentioned herein is just example, where an exact value is dependent on a type of products manufactured in a semiconductor fabrication and may be set during the qualification stage. As used herein, "optimal" or "optimal property/characteristic" may refer to an acceptable or desirable property/characteristic that is usually determined by comparison with a target property.

The film quality controller (130) may be configured to detect that the quality of the film is acceptable or desirable (e.g., optimal), in response to determining that the characteristic of the film matches to the standard. The film quality controller (130) may be configured to detect that the quality of the film is not acceptable or desirable (e.g., not optimal), in response to determining that the characteristic of the film does not match to the standard The film quality controller (130) may be configured to determine parameters of the spin coating, in response to detecting that the quality of the film is not acceptable or desirable (e.g., not optimal). In some embodiments, the parameters of the spin coating may include, for example, a spin speed of the spinner (120), a spin acceleration of the spinner (120), a drying rate of the film, a time to complete the spin coating, an ambient temperature, an ambient pressure, and an ambient humidity. The film quality controller (130) may be configured to estimate the thickness of the film at an end of the spin coating based on the parameters. The thickness of the film 'h' after time 't' (i.e., end of spin coating) may be determined using equation 2.

$$h = \frac{h0}{\sqrt{1 + 4.h0^2.\rho.\omega^2.\frac{t}{3}.\eta}} \qquad (2)$$

where, h0 is a height of the film at current time. The film quality controller (130) may be configured to check a difference between the estimated thickness of the film and a standard thickness required for the film. The film quality controller (130) is configured to modify the parameters of the spin coating to achieve the standard thickness of the film within a remaining time for the end of the spin coating based on the difference between the estimated thickness of the film and a predetermined thickness (e.g., a standard thickness desirable or required for the film).

Although FIG. 1 shows the hardware components of the system (100) it is to be understood that embodiments of the invention are not limited thereon. In some embodiments, the system (100) may include less or more number of components or may include additional components not shown in FIG. 1. Further, the labels or names of the components are used only for illustrative purpose and does not limit the scope of the invention. One or more components may be combined together to perform same or similar function for determining the quality of the film in the spin coating process.

FIGS. 2A-2C are block diagrams of the imaging device (110) of the system (100) for generating an image of a film, according to some embodiments of the invention. In some embodiments, the imaging device (110) may include the SPCs (111), the lenses (112), the film image generator (113), the memory (114), the processor (115), and the communicator (116) as shown in the FIG. 2A. The lenses (112) may include the correction lens and/or the micro lens. In some embodiments, the correction lens may receive light reflected from the film and may focus the light to an aperture, where each SPC (111) captures the image of each portion of the film by receiving the light from the aperture through the micro lens.

In order to increase a resolution of the image of the film, a bigger aperture may be used in the imaging device (110). The image of the substrate may be divided into different zonal regions. Each micro lens of each SPC (111) may be tuned for sharp FOV of a specified zonal region of the substrate. Thus, the SPCs (111) may inherently provide multi-view imaging of the substrate and film. Intensity of the incident light reached at each SPC (111) after passing through the micro lens from different parts of the substrate may have radial gradient distribution. A darker area of the radial gradient distribution may have more noise due to lens aberration while a brighter area of the radial gradient distribution may be a noise-free area. The intensity of the incident light corresponds to an outer region of the radial gradient distribution that is too low to get detected by the SPCs (111).

In some embodiments, the imaging device (110) may include the SPCs (111), the SLMs (117), the film image generator (113), the memory (114), the processor (115), and the communicator (116) as shown in the FIG. 2B. In some embodiments, the SLM (117) may include a first TSLM and a second TSLM. The first TSLM may receive the light reflected from the film and may focus the light to the aperture, where the SPC (111) may capture the image of each portion of the film by receiving the light from the aperture through the second TSLM. In some embodiments, the SLM (117) may include the TSLM and the RSLM. The TSLM may receive the light reflected from the film and may focus the light to the aperture, where the RSLM may reflect the light from the aperture to the SPC (111). Further, the SPC (111) may capture the image of each portion of the film based on the light reflected from the RSLM.

In some embodiments, the imaging device (110) may include the SPCs (111), the lens (112), the SLMs (117), the film image generator (113), the memory (114), the processor (115), and the communicator (116) as shown in the FIG. 2C. In some embodiments, the lens (112) may be the correction lens. In some embodiments, the SLM (117) may be the TSLM. The lens (112) may receive the light reflected from the film and may focus the light to the aperture, where the SPC (111) captures the image of each portion of the film by receiving the light from the aperture through the TSLM. In some embodiments, the SLM (117) may include the RSLM. The lens (112) may receive the light reflected from the film and focuses the light to the aperture, where the RSLM reflects the light from the aperture to the SPC (111). Further, the SPC (111) may capture the image of each portion of the film based on the light reflected from the RSLM.

Compressed sensing may enable low data footprint during capture. The combination of the SPC (111) and compress sensing may bring down data generation rate (e.g. 180 Mbps). Multiple conventional cameras may be used or required to capture a full wafer image with similar resolution. In a multiple conventional camera setup including, for example, 4 cameras, a data generation rate may be about 7.2 Gbps. As in compressed sensing, an entire scene may not be needed to be captured using the hardware, instead image processing may be performed on the incoherent and sparse sampling of scene (e.g., only 10% of the entire scene may be used or required) for full image reconstruction. Therefore, the data generation rate may be reduced by 40 times total (4*10) compared to the conventional cameras. So, the data generation rate may be 7.2 Gbps/40~180 Mbps.

Although FIGS. 2A-2C are showing the hardware components of the imaging device (110), it is to be understood that embodiments of the invention are not limited thereon. In some embodiments, the imaging device (110) may include less or more number of components or may include additional components not shown in FIGS. 2A through 2C. Further, the labels or names of the components are used only for illustrative purpose and does not limit the scope of the invention. One or more components may be combined together to perform same or similar function for generating the image of the film.

Figure 3:
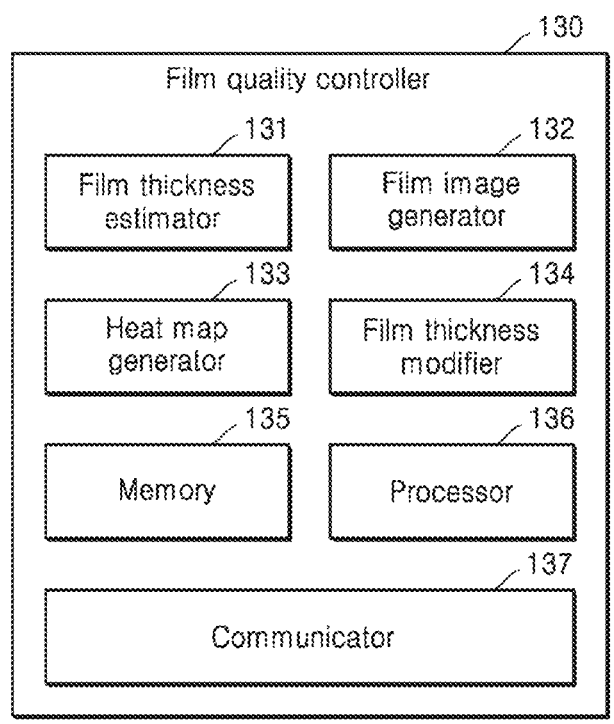
FIG. 3 is a block diagram of a film quality controller of a system for determining a quality of a film, according to some embodiments of the invention.

FIG. 3 is a block diagram of a film quality controller (130) of a system (100) for determining a quality of a film, according to some embodiments of the invention. In some embodiments, the film quality controller (130) may include a film thickness estimator (131), a film image generator (132), a heat map generator (133), a film thickness modifier (134), a memory (135), a processor (136), and a communicator (137). The film thickness estimator (131), the film image generator (132), the heat map generator (133), the film thickness modifier (134) may be implemented by processing circuitry such as logic gates, integrated circuits, microprocessors, microcontrollers, memory circuits, passive electronic components, active electronic components, optical components, hardwired circuits, or the like, and may optionally be driven by a firmware. The circuits may, for example, be embodied in one or more semiconductor chips, or on substrate supports such as printed circuit boards and the like.

The film thickness estimator (131) may receive an image of the film or images of portions of the film from the imaging device (110). In response to receiving the images of the portions of the film from the imaging device (110), the film image generator (132) may generate the image of the film using the images of the portions of the film. The film thickness estimator (131) may estimate the characteristic of the film using the image of the film. The film thickness estimator (131) may determine whether the characteristic of the film matches to the standard based on the estimated characteristic of the film.

In some embodiments, the heat map generator (133) may determine the pixel values of the image. Further, the heat map generator (133) may generate the heat map of the image based on the pixel values in the image. Further, the film thickness estimator (131) may determine whether the characteristic of the film matches to the standard based on the heat map.

The film thickness modifier (134) may detect that the quality of the film is acceptable or desirable (e.g., optimal), in response to determining that the characteristic of the film matches to the standard. The film thickness modifier (134) may detect that the quality of the film is not acceptable or desirable (e.g., not optimal), in response to determining that the characteristic of the film does not match to the standard. The film thickness estimator (131) may determine the parameters of the spin coating, in response to detecting that the quality of the film is not acceptable or desirable (e.g., not optimal). The film thickness estimator (131) may estimate the thickness of the film at the end of the spin coating based on the parameters. The film thickness estimator (131) may check the difference between the estimated thickness of the film and a predetermined thickness (e.g., the standard thickness desirable or required for the film). The film thickness estimator (131) may modify the parameters of the spin coating to achieve the predetermined thickness of the film within the remaining time of the spin coating based on the difference between the estimated thickness of the film and the predetermined thickness. The film thickness estimator (131) may adjust/change the parameters of the spin coating process to form the film having the predetermined thickness at the time the spin coating process is completed based on the difference between the estimated thickness of the film and the predetermined thickness.

The memory (135) may store the images of the portions of the film and the image of the film. The memory (135) may include, for example, non-volatile storage elements. Examples of such non-volatile storage elements may include magnetic hard discs, optical discs, floppy discs, flash memories, or forms of an Electrically Programmable Memory (EPROM) or an Electrically Erasable and Programmable Memory (EEPROM). In addition, the memory (135) may, in some embodiments, be considered a non-transitory storage medium. The term "non-transitory" may indicate that the storage medium is not embodied in a carrier wave or a propagated signal. However, the term "non-transitory" should not be interpreted that the memory (135) is non-movable. In some examples, the memory (135) may be configured to store larger amounts of information than the memory (135) respectively. In some embodiments, a non-transitory storage medium may store data that may be changed, over time (e.g., in Random Access Memory (RAM) or cache).

The processor (136) may be configured to execute instructions stored in the memory (135). The processor (136) may be a general-purpose processor, such as a Central Processing Unit (CPU), an Application Processor (AP), or the like, a graphics-only processing unit such as a Graphics Processing Unit (GPU), a Visual Processing Unit (VPU) and the like. The processor (136) may include multiple cores to execute the instructions. The communicator (137) may be configured to communicate internally between hardware components in the film quality controller (130). Further, the communicator (137) may be configured to facilitate communication between the film quality controller (130) and other components in the system (100). The communicator (137) may include an electronic circuit specific to a standard that enables wired or wireless communication.

Although FIG. 3 shows the hardware components of the film quality controller (130), it is to be understood that embodiments of the invention are not limited thereon. In some embodiments, the film quality controller (130) may include less or more number of components or may include additional components not shown in FIG. 3. Further, the labels or names of the components are used only for illustrative purpose and does not limit the scope of the invention. One or more components may be combined together to perform same or similar function for determining the quality of the film based on the thickness of the film.

Figure 4:
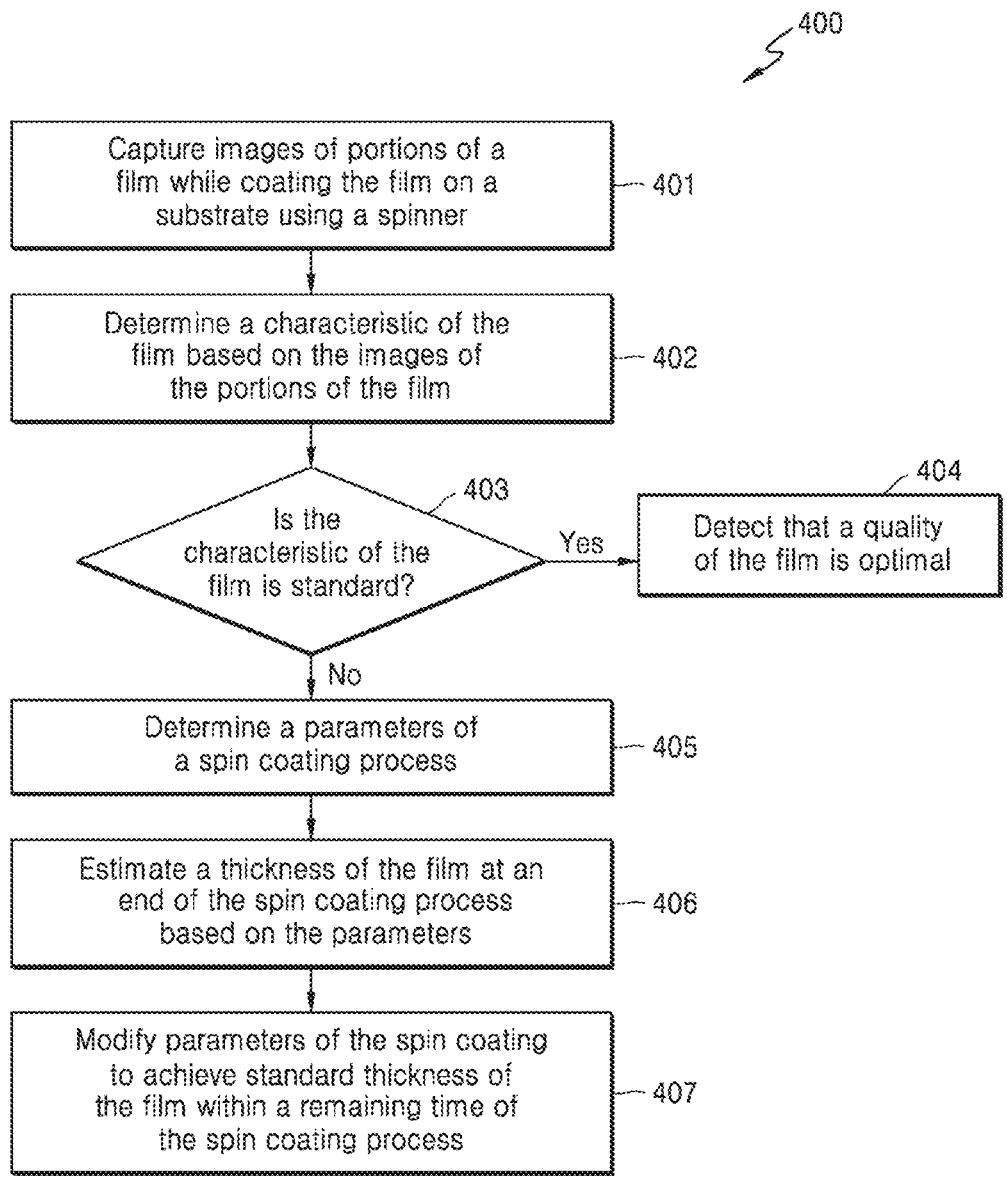
FIG. 4 is a flow diagram illustrating a method for determining a quality of a film in a spin coating process, according to some embodiments of the invention.

FIG. 4 is a flow diagram 400 illustrating a method for determining a quality of a film in a spin coating process, according to some embodiments of the invention. The method may include capturing images of portions of a film while coating the film on a substrate using the spinner (120) (Block 401). In some embodiments, the method may allow the imaging device (110) to capture the images of the portions of the film while coating the film on the substrate using the spinner (120). The method may include determining or estimating a characteristic of the film based on the images of the portions of the film (Block 402). In some embodiments, the method may allow the film thickness estimator (131) to determine or estimate the characteristic of the film based on the images of the portions of the film. The method may include determining whether the characteristic of the film matches to the standard (Block 403). In some embodiments, the method may allow the film thickness estimator (131) to determine whether the characteristic of the film matches to the standard.

The method may include detecting or determining that the quality of the film is acceptable or desirable (e.g., optimal), in response to determining that the characteristic of the film matches to the standard (Block 404). In some embodiments, the method may allow the film thickness modifier (134) to detect or determine that the quality of the film is acceptable or desirable (e.g., optimal), in response to determining that the characteristic of the film matches to the standard. The method may include determining the parameters of the spin coating, in response to determining that the characteristic of the film does not match to the standard (Block 405). In some embodiments, the method may allow the film thickness modifier (134) to determine the parameters of the spin coating, in response to determining that the characteristic of the film does not match to the standard. The method may include estimating the thickness of the film at the end of the spin coating based on the parameters (Block 406). In some embodiments, the method may allow the film thickness modifier (134) to estimate the thickness of the film at the end of the spin coating based on the parameters. The method may include modifying or adjusting the parameters of the spin coating to achieve the standard thickness of the film within the remaining time of the spin coating (Block 407). In some embodiments, the method may allow the film thickness modifier (134) to modify or adjust the parameters of the spin coating to achieve the standard thickness of the film within the remaining time of the spin coating process.

The various actions, acts, blocks, steps, or the like in the flow diagram 400 may be performed in the order presented, in a different order or simultaneously or concurrently. Further, in some embodiments, some of the actions, acts, blocks, steps, or the like may be omitted, added, modified, skipped, or the like without departing from the scope of the invention.

Figure 5:
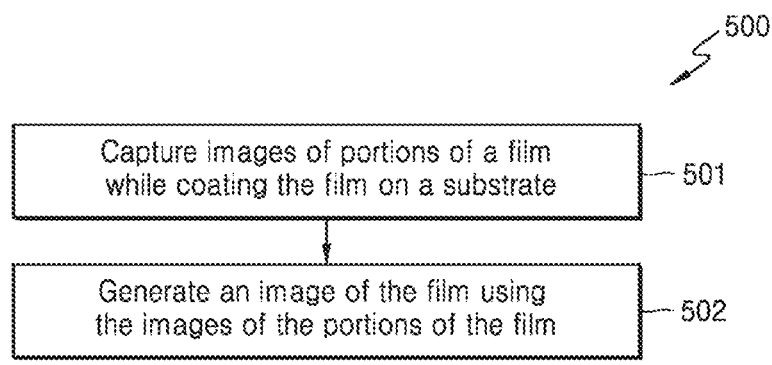
FIG. 5 is a flow diagram illustrating a method for generating an image of a film, according to some embodiments of the invention.

FIG. 5 is a flow diagram 500 illustrating a method for generating an image of a film, according to some embodiments of the invention. The method may include capturing images of portions of the film while coating the film on the substrate (Block 501). In some embodiments, the method may allow the SPCs (111) to capture the images of the portions of the film while coating the film on the substrate. The method may include generating an image of the film using the images of the portions of the film (Block 502). In some embodiments, the method may allow the film image generator (113) to generate the image of the film using the images of the portions of the film. In some embodiments, the method may allow the film image generator (132) to generate the image of the film using the images of the portions of the film.

The various actions, acts, blocks, steps, or the like in the flow diagram 500 may be performed in the order presented, in a different order or simultaneously or concurrently. Further, in some embodiments, some of the actions, acts, blocks, steps, or the like may be omitted, added, modified, skipped, or the like without departing from the scope of the invention.

Figure 6:
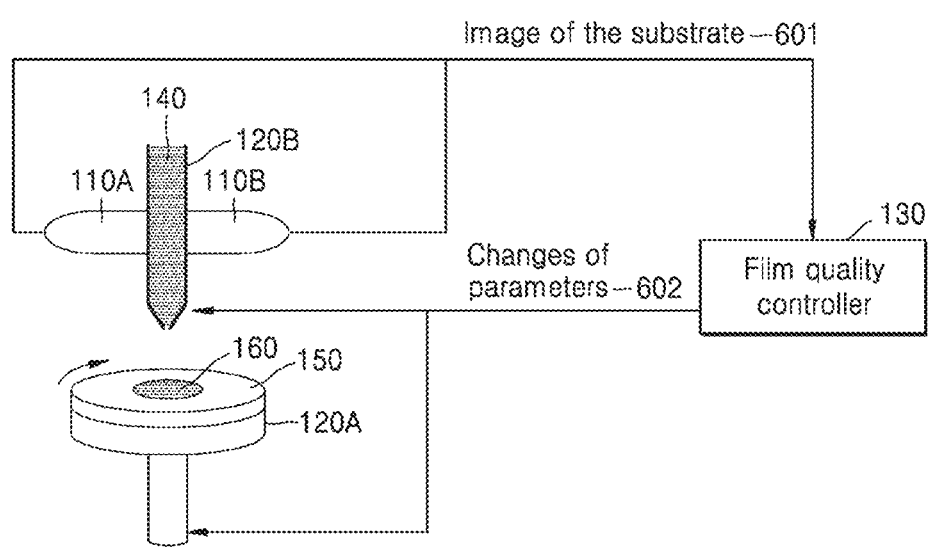
FIG. 6 illustrates a schematic diagram of a system for controlling parameters of a spin coating process, according to some embodiments of the invention.

FIG. 6 illustrates a schematic diagram of the system (100) for controlling or adjusting parameters of a spin coating process, according to some embodiments of the invention. The spinner (120) may include a rotating disc (120A) and a nozzle (120B). The substrate (150) may be placed over the rotating disc (120A). The nozzle (120B) may be placed above the substrate (150) by a distance (e.g., 1 cm) from the substrate (150). The nozzle (120B) may store a solvent (140) in its storage space. The nozzle (120B) may dispense the solvent (140) over the substrate (150) while the substrate (150) is rotating along with the rotating disc (120A). Two imaging devices (110A, 110B) may be arranged aside the nozzle (120B), where the number of the imaging devices (110A, 110B) may not be limited to two. In some embodiments, the system (100) may include three or more imaging devices. Each imaging device (110A, 110B) may capture images of the substrate (150), where images of the film are also included in the images of the substrate (150). In some embodiments, the imaging devices (110A, 110B) may be arranged anywhere within the system (100) to capture the images of the substrate (150). A casing may be used to enclose the imaging devices (110A, 110B) for providing a protection to the imaging devices (110A, 110B) without blocking the functionality of the imaging devices (110A, 110B). Multiple imaging devices (110A, 110B) may be operated together to scale the images to an even higher resolution of an image reconstruction.

In response to capturing the images of the film (160), the imaging devices (110A, 110B) may provide (601) the images of the film (160) to the film quality controller (130). The film quality controller (130) may analyze the characteristic of the film using the image. In response to detecting an irregularity in the characteristic of the film, the film quality controller (130) may determine the changes that needs to be made to the parameters of the spin coating for making the film uniform. Further, the film quality controller (130) may provide (602) the changes of the parameters of the spin coating to the spinner (120). Further, the spinner (120) may adjust the parameters of the spin coating process based on the changes for making the film uniform.

Figure 7A:
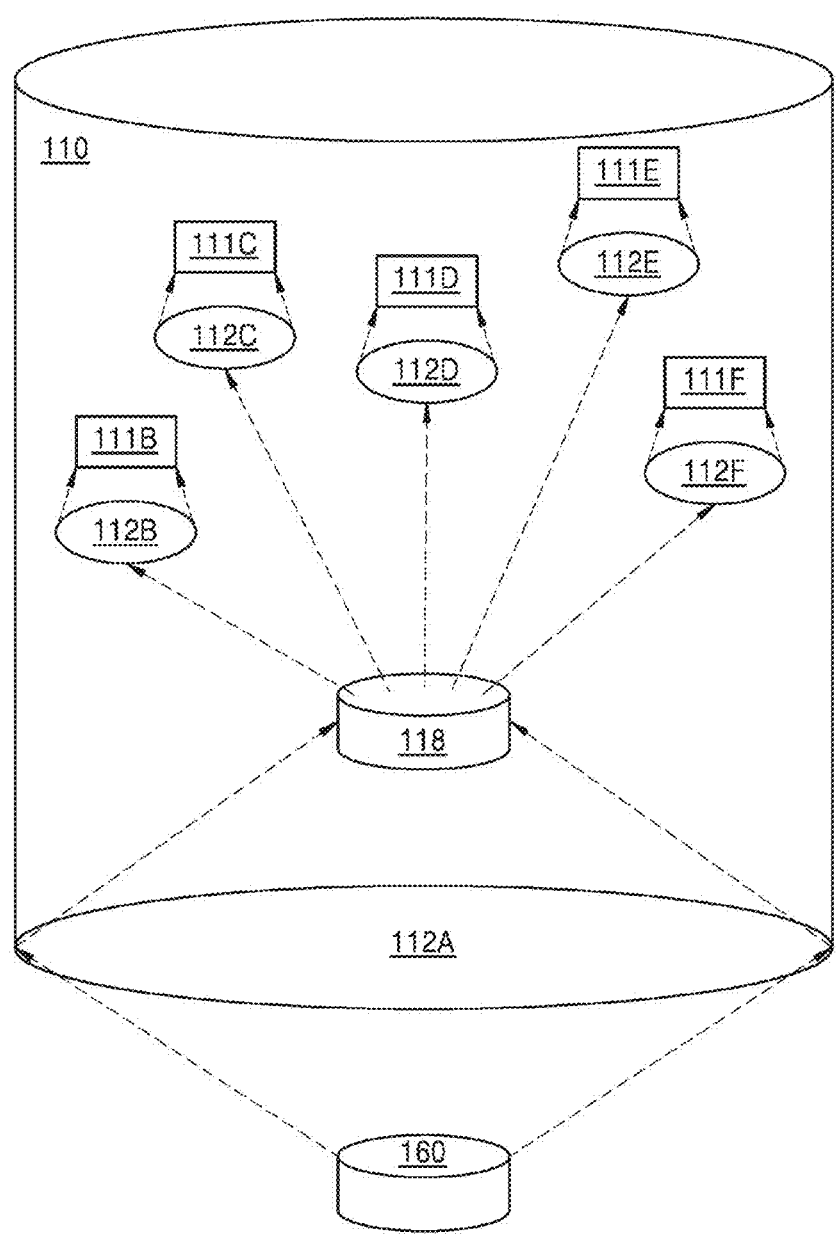
FIGS. 7A-7C illustrates a schematic diagram of an imaging device of a system for generating an image of a film, according to some embodiments of the invention.
Figure 7B:
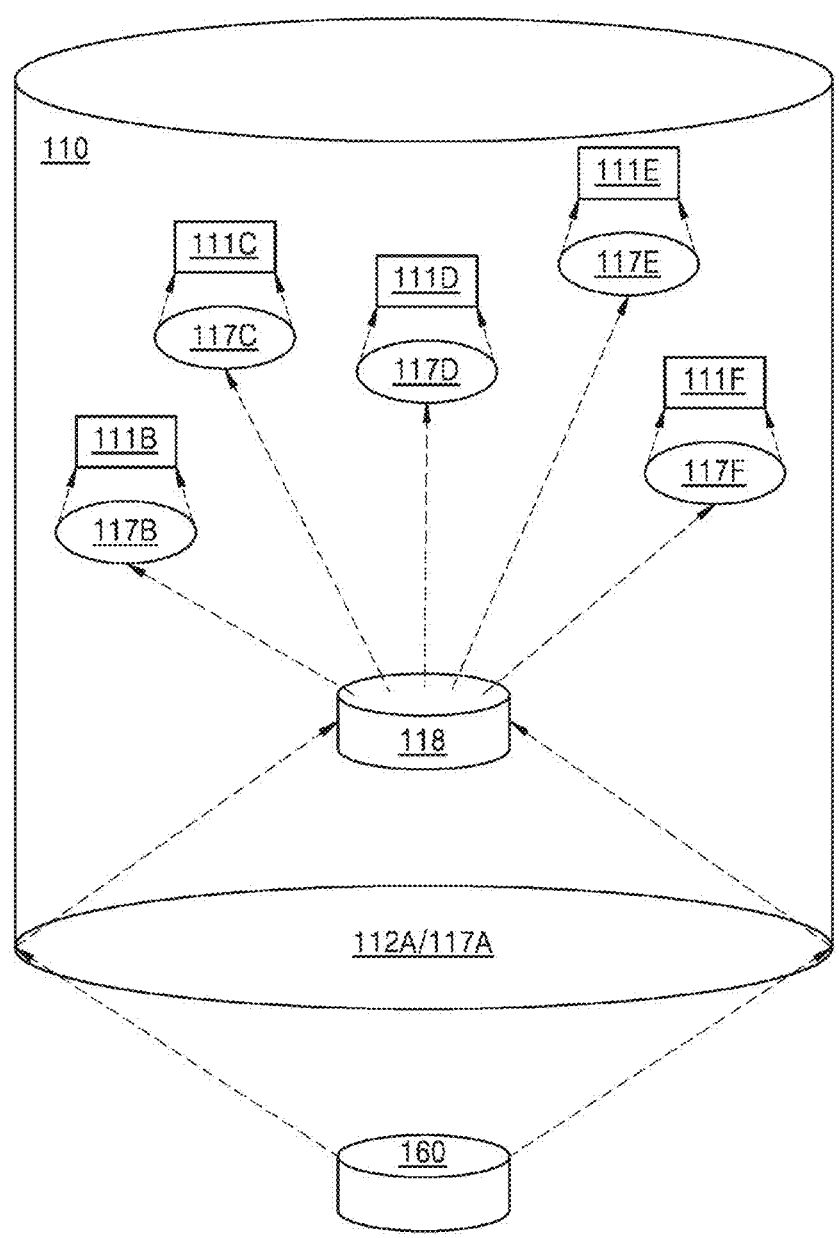
Figure 7C:
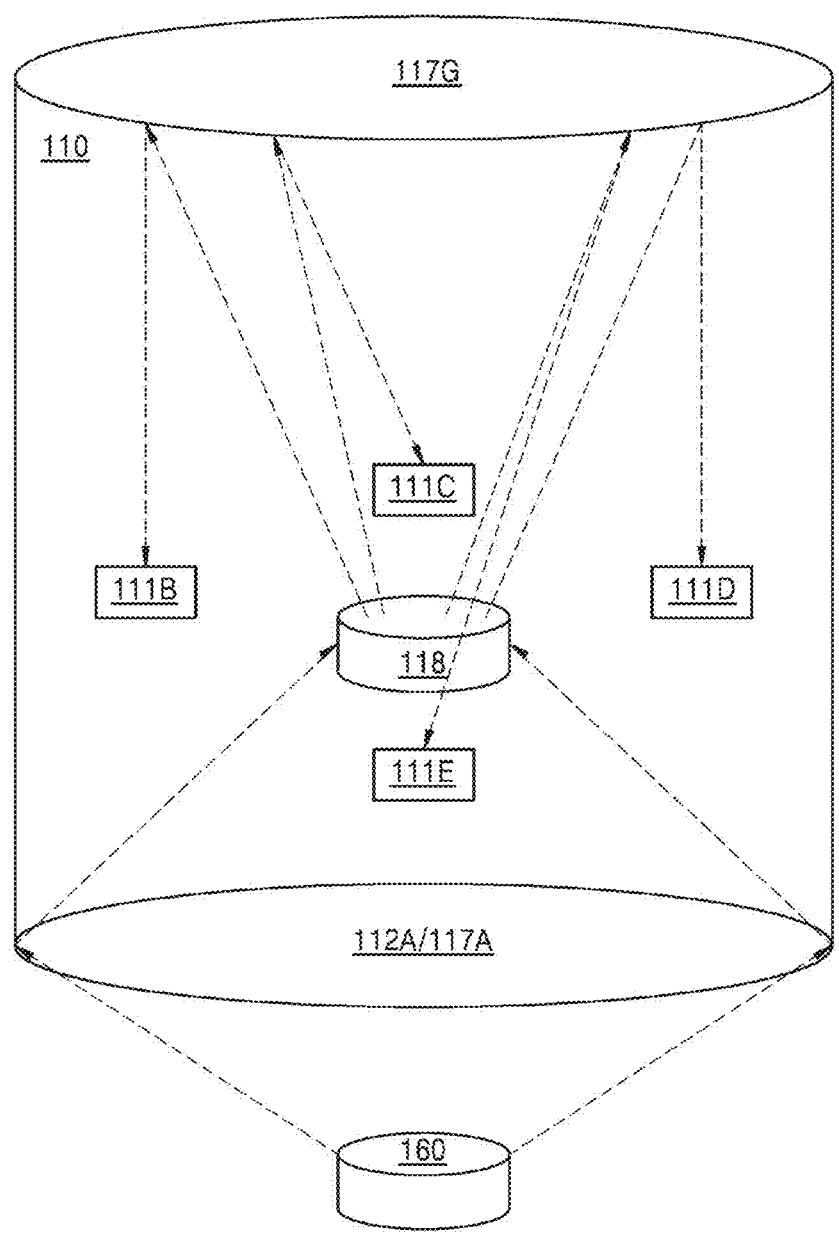

FIGS. 7A-7C illustrate schematic diagrams of the imaging device (110) of the system (100) for generating an image of a film (160), according to some embodiments of the invention. In some embodiments, the imaging device (110) may include a correction lens (112A), five micro lenses (112B-112F), and five SPCs (111B-111F) as shown in the FIG. 7A. The number of the micro lenses (112B-112F) and the SPCs (111B-111F) are not limited to five. The imaging device (110) may include any number of the micro lenses (112B-112F) and the SPCs (111B-111F). The correction lens (112A) may be arranged to receive the light reflected from the film (160) and to focus the image of the film (160) to the aperture (118). The SPCs (111B-111F) may be randomly distributed and arranged above the aperture (118), where one SPC (e.g., SPC (111B)) may not block the FOV of other SPCs (e.g., SPCs (111C-111F)). The micro lenses (112B-112F) may be arranged below the SPCs (111B-111F), respectively, for focusing each portion of the image from the aperture to each SPC (111B-111F). Further, the SPCs (111B-111F) may capture images of each portion of the image of the film (160).

The imaging device (110) may capture the image of the film under the exposure of the visible light spectrum as per the design shown in the FIG. 7A. In some embodiments, 1000 SPCs may be used in each imaging device (110) where a data bandwidth requirement may be considerably reduced even at much higher frame rate. Further, an image processing of the captured images in real-time may be an easy process by maintaining the frame rate to 30 frames per second. In order to maintain a processing speed of 1 KHz, 30 to 40 distributed SPC (111) may be enough to capture the image of the film (160) that is subjected to the rotation motion. Further, more SPC (111) may be added to the imaging device (110) based on a throughput requirement.

In some embodiments, the imaging device (110) may include the correction lens (112A) or the first TSLM (117A), five TSLMs (117B-117F), and five SPCs (111B-111F) as shown in the FIG. 7B. In some embodiments, the number of the TSLMs (117B-117F) and the SPCs (111B-111F) are not limited to five. The imaging device (110) may include any number of the TSLMs (117B-117F) and the SPCs (111B-111F). The correction lens (112A) and/or the first TSLM (117A) may be arranged to receive the light reflected from the film (160) and to focus the image of the film (160) to the aperture (118). The SPCs (111B-111F) may be randomly distributed and arranged above the aperture (118), where one SPC (e.g., SPC (111B)) may not block the FOV of other SPCs (e.g., SPCs (111C-111F)). The TSLMs (117B-117F) may be arranged below the SPCs (111B-111F), respectively, for focusing each portion of the image from the aperture to each SPC (111B-111F). Further, the SPCs (111B-111F) may capture images of each portion of the image of the film (160).

The imaging device (110) may capture the image of the film under the exposure of the visible light spectrum or the invisible light spectrum (e.g., infrared light) as per the design shown in the FIG. 7B. Each TSLM (117B-117F) may simultaneously or concurrently converge incoming rays into corresponding SPC (111B-111F). A transition speed of the TSLM (117B-117F) may range in 0.480 KHz-32 KHz. The image stabilization of the SPCs (111B-111F), may be faster (e.g., 20 nanoseconds for underexposure of IR, and 4 Nanosecond under exposure of the visible light). Hence, the frame rate of the imaging device (110) may be also in a range of 0.480 kHz-32 kHz, which may be fast enough to capture the image of the film (160) subjected to the rotation motion of a maximum speed in order of 0.1 KHz.

In some embodiments, the imaging device (110) may include the correction lens (112A) or the first TSLM (117A), the RSLM (117G), and four SPCs (111B-111E) as shown in the FIG. 7C. In some embodiments, the number of the SPCs (111B-111E) are not limited to four. The imaging device (110) may include any number of the SPCs (111B-111F).

The correction lens (112A) and/or the first TSLM (117A) may be arranged to receive the light reflected from the film (160) and to focus the image of the film (160) to the aperture (118). The SPCs (111B-111E) may be randomly distributed and arranged aside the aperture (118), where one SPC (e.g., SPC (111B)) may not block the FOV of other SPCs (e.g., SPCs (111C-111E)). The RSLM (117G) may be arranged above the SPCs (111B-111E) or the aperture (118) for focusing each portion of the images reflected from the aperture to each SPC (111B-111F). Further, the SPCs (111B-111F) may capture images of each portion of the image of the film (160). The imaging device (110) may capture the image of the film under the exposure of the visible light spectrum or the invisible light spectrum (e.g., infrared light) as per the design shown in the FIG. 7C. The RSLM (117G) may sequentially change a phase modulation to target one specific SPC (e.g., SPC (111B)) in the imaging device (110). The transition speed of the RSLM (117G) may range from 1 Mhz-1 GHz. Further, a transition times across 1000 SPC thus may be done in kHz-MHz speed. In this case, the frame rate may be depended on a transition speed of the RSLM (117G) which may be in the range of 1 Mhz-1 Ghz.

For creating each full image, sequential transition of the RSLM (117G) for each of the 1000 SPCs may be used or needed. Thus, the frame rate may become 1000×1 MHz-1 Ghz or 1 Khz-1 Mhz. Exact value of the frame rate may depend on the transition speed of the RSLM (117G). For example, if the transition speed of the RSLM (117G) is 10 MHz, then the frame rate may be 10 KHz. The image stabilization of the SPCs (111B-111F) may be faster (e.g., 20 Nanosecond for underexposure of IR, and 4 Nanosecond under exposure of the visible light). Hence, the frame rate of the imaging device (110) is also in a range of 0.480 kHz-1 MHz, which may be fast enough to capture the image of the film (160) subjected to the rotation motion of a maximum speed in order of 0.1 kHz.

Due to not using any mechanical parts such as a camera shutter, the imaging device (100) may capture the images of the portions of the film (160) in the high frame rate based on the sampling rate to capture the images. Therefore, the images of the portions of the film may be very clear, in order to obtain necessary information about the film.

Figure 8:
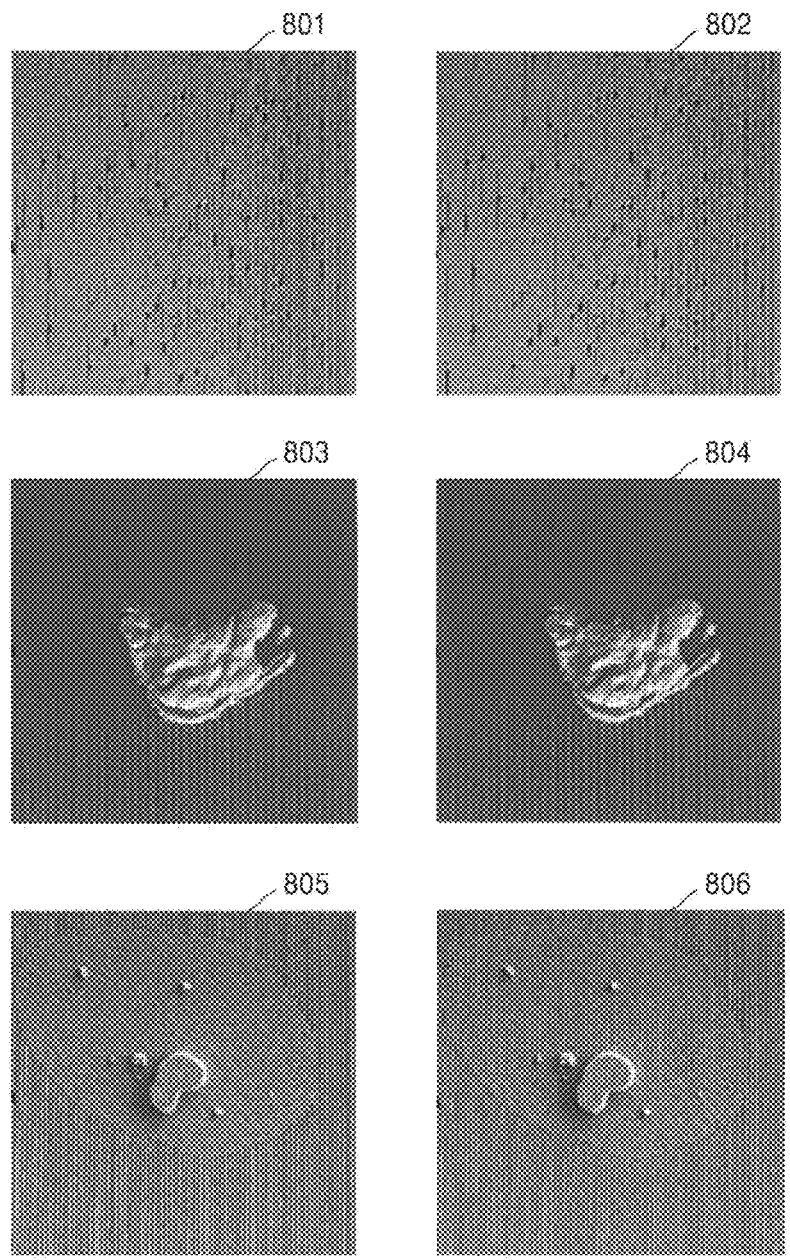
FIG. 8 shows original images and reconstructed images of sample objects, according to some embodiments of the invention.

FIG. 8 illustrates a comparison of original images and reconstructed images of sample objects, according to some embodiments of the invention. For this example, the ADMM-Net with 15-stages is trained with 7e5 epochs using a train dataset containing 500 SEM images under-sampled at a 20% rate. An original image of a first sample object is shown in 801, where the image of the first sample object reconstructed using the ADMM-Net method is shown in 802. An original image of a second sample object is shown in 803, where the image of the second sample object reconstructed using the ADMM-Net method is shown in 804. An original image of a third sample object is shown in 805, where the image of the second sample object reconstructed using the ADMM-Net method is shown in 806. Metrics used in the example for evaluating performance and an error of the reconstructed image are Peak Signal to Noise Ratio (PSNR) and Normalized Mean Squared Error (NMSE), respectively. The PSNR>30 dB and NMSE<0.09 for the reconstructed images (802, 804, 806).

The foregoing descriptions of the embodiments will so fully reveal the general nature of the embodiments herein that others can, by applying current knowledge, readily modify and/or adapt for various applications such specific embodiments without departing from the scope of the invention, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, those skilled in the art will recognize that the embodiments described herein can be practiced with modification within the scope of the invention.

What is claimed is:

1. A system for determining a quality of a film in a spin coating process, the system comprising:
    a film quality controller configured to:
        capture, using a first imaging device, images of a plurality of portions of the film while coating the film on a substrate using a spinner, wherein the images of the plurality of portions of the film correspond to a sample of the film that is less than an entirety of the film; and
        generate an image of the film based on the images of the plurality of portions of the film and a plurality of training images of the entirety of film captured by a second imaging device, wherein the image of the film corresponds to the entirety of the film;
        estimate a characteristic of the film using the image of the film;
        determine whether or not the film has a target characteristic based on the image of the film; and
        selectively modify at least one parameter of the spin coating process based on a determination of whether or not the film has the target characteristic.

2. The system of claim 1, wherein determining whether or not the film has the target characteristic comprises:
    determining whether the characteristic of the film is identical to the target characteristic.

3. The system of claim 1, wherein determining whether or not the film has the target characteristic comprises:
    determining pixel values of the image of the film;
    generating a heat map of the image of the film based on the pixel values of the image of the film;
    identifying, from among a plurality of reference heat maps, a target reference heat map associated with the target characteristic; and
    determining whether the film has the target characteristic based on the heat map and the target reference heat map.

4. The system of claim 1, wherein, to selectively modify the at least one parameter of the spin coating process based on the determination of whether or not the film has the target characteristic, the film quality controller is further configured to:
    determine at least one parameter of the spin coating process in response to determining that the film does not have the target characteristic;
    estimate a thickness of the film at an end of the spin coating process based on the at least one parameter; and
    modify the at least one parameter of the spin coating process to form the film having a target thickness at the end of the spin coating process.

5. The system of claim 4, wherein the at least one parameter of the spin coating process comprises a spin speed of the spinner, a spin acceleration of the spinner, a drying rate of the film, an ambient temperature, an ambient pressure and/or an ambient humidity.

6. The system of claim 4, wherein the at least one parameter of the spin coating process comprises a time remaining until the end of the spin coating process.

7. The system of claim 1, wherein the target characteristic of the film comprises a thickness of the film, a uniformity of the film across the substrate, a viscosity of a film fluid, a radial velocity of the film fluid, a density of the film fluid and/or an area of the substrate covered by the film.

8. The system of claim 1, further comprising an imaging device including a plurality of Single Pixel Cameras (SPCs) and at least one of: at least one lens or at least one Spatial Light Modulator (SLM).

9. The system of claim 8, wherein the SLM comprises a Transmissive Spatial Light Modulator (TSLM) and/or a Reflective Spatial Light Modulator (RSLM).

10. The system of claim 8, wherein the SPCs are arranged in the imaging device so as to not block field of views (FOVs) of each other.

11. The system of claim 8,
wherein the least one lens comprises a micro lens or a correction lens;
wherein the correction lens is configured to receive light reflected from the film and focus the light to an aperture; and
wherein each SPC is configured to capture the image of each portion of the plurality of portions of the film by receiving the light from the aperture through the micro lens.

12. The system of claim 1, wherein the capture of images of a plurality of portions of the film is performed under an exposure of visible and invisible light spectrums.

13. A system for determining a quality of a film in a spin coating process, the system comprising:
a plurality of single pixel cameras (SPCs) configured to capture images of a plurality of portions of the film while coating the film on a substrate using a spinner, wherein the images of the plurality of portions of the film correspond to a sample of the film that is less than an entirety of the film; and
a film quality controller configured to:
perform a compressive sensing routine to generate an image of the film based on the images of the plurality of portions of the film and a transfer matrix, wherein the image of the film corresponds to the entirety of the film, and wherein the transfer matrix is based on a plurality of training images of the entirety of the film that are captured by an imaging device that is different from the plurality of SPCs;
determine whether the film has a target characteristic based on the image of the film; and
selectively modify at least one parameter of the spin coating process based on a determination of whether the film has the target characteristic.

14. The system of claim 13, wherein determining whether the film has the target characteristic comprises:
determining pixel values of the image of the film;
generating a heat map of the image based on the pixel values;
identifying, from among a plurality of reference heat maps, a target reference heat map associated with the target characteristic; and
determining whether the film has the target characteristic based on a comparison between the heat map and the target reference heat map.

15. The system of claim 13, wherein the film quality controller is further configured to:
determine at least one parameter of the spin coating process in response to determining that the film does not have the target characteristic;
estimate a thickness of the film at an end of the spin coating process based on the at least one parameter; and
modify the at least one parameter of the spin coating process to form the film having a target thickness at the end of the spin coating process.

16. The system of claim 15, wherein the at least one parameter of the spin coating process comprises a spin speed of the spinner, a spin acceleration of the spinner, a drying rate of the film, an ambient temperature, an ambient pressure and/or an ambient humidity.

17. The system of claim 13, wherein the target characteristic of the film comprises a thickness of the film, a uniformity of the film across the substrate, a viscosity of a film fluid, a radial velocity of the film fluid, a density of the film fluid and/or an area of the substrate covered by the film.

18. A system for determining a quality of a film in a spin coating process, the system comprising:
an imaging device comprising a plurality of Single Pixel Cameras (SPCs) and at least one of a lens or a Spatial Light Modulator (SLM), wherein the imaging device is configured to capture images of a plurality of portions of the film while coating the film on a substrate using a spinner, and wherein the images of the plurality of portions of the film correspond to a sample of the film that is less than an entirety of the film; and
a film quality controller configured to:
perform a compressive sensing routine to generate an image of the film based on the images of the plurality of portions of the film and a transfer matrix, wherein the image of the film corresponds to the entirety of the film, and wherein the transfer matrix is based on a plurality of training images of the entirety of the film that are captured by an imaging device that is different from the plurality of SPCs;
generate a heat map based on the image of the film;
determine whether the film has a target characteristic based on the heat map;
determine at least one parameter of the spin coating process in response to determining that the heat map does not have the target characteristic;
estimate a thickness of the film at an end of the spin coating process based on the at least one parameter; and
modify the at least one parameter of the spin coating process to form the film having a target thickness at the end of the spin coating process based on the thickness that was estimated.

* * * * *